US010409674B2

(12) United States Patent
Lin et al.

(10) Patent No.: US 10,409,674 B2
(45) Date of Patent: Sep. 10, 2019

(54) DECODING METHOD, MEMORY CONTROL CIRCUIT UNIT AND MEMORY STORAGE APPARATUS

(71) Applicant: PHISON ELECTRONICS CORP., Miaoli (TW)

(72) Inventors: Wei Lin, Taipei (TW); Tien-Ching Wang, Kaohsiung (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 181 days.

(21) Appl. No.: 15/084,454

(22) Filed: Mar. 29, 2016

(65) Prior Publication Data

US 2017/0255511 A1     Sep. 7, 2017

(30) Foreign Application Priority Data

Mar. 2, 2016   (TW) .............................. 105106303 A

(51) Int. Cl.
| | |
|---|---|
| G11C 29/00 | (2006.01) |
| G06F 11/10 | (2006.01) |
| G06F 3/06 | (2006.01) |
| G11C 29/52 | (2006.01) |
| G11C 11/56 | (2006.01) |
| G11C 29/04 | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01); *G11C 11/5642* (2013.01); *G11C 2029/0411* (2013.01)

(58) Field of Classification Search
CPC ...... G06F 11/10; G06F 11/1068; G06F 13/16; G06F 3/06; G06F 3/0619; G06F 3/064; G06F 3/0679; G11C 11/56; G11C 16/26; G11C 16/34; G11C 29/52
See application file for complete search history.

(56) References Cited

U.S. PATENT DOCUMENTS

| | | | | |
|---|---|---|---|---|
| 9,397,701 | B1 * | 7/2016 | Micheloni | ............. H03M 13/13 |
| 9,454,420 | B1 * | 9/2016 | Tai | ......... G06F 11/073 |
| 2008/0092026 | A1 * | 4/2008 | Brandman | .......... G06F 11/1072 |
| | | | | 714/793 |
| 2008/0123419 | A1 * | 5/2008 | Brandman | .......... G06F 11/1072 |
| | | | | 365/185.09 |
| 2012/0001778 | A1 * | 1/2012 | Steiner | .................. H03M 13/09 |
| | | | | 341/94 |

(Continued)

*Primary Examiner* — Albert Decady
*Assistant Examiner* — Enamul M Kabir
(74) *Attorney, Agent, or Firm* — JCIPRNET

(57) ABSTRACT

A decoding method for a rewritable non-volatile memory module is provided. The method includes reading data from a plurality of memory cells of the rewritable non-volatile memory module according to a first voltage, wherein the data includes a user data string and an error checking and correcting code set. The method also includes decoding at least part of sub data units i the user data string according to a first decoding algorithm to obtain a plurality of decoded sub data units. The method further includes restoring a value of the corrected bit to an original bit value if a corrected bit in the decoded sub data units matches a reliability condition.

24 Claims, 10 Drawing Sheets

(56) References Cited

U.S. PATENT DOCUMENTS

| | | | |
|---|---|---|---|
| 2015/0363264 A1* | 12/2015 | Cai | G06F 11/1068 |
| | | | 714/6.11 |
| 2016/0098316 A1* | 4/2016 | Lin | G06F 11/1068 |
| | | | 714/764 |
| 2016/0133334 A1* | 5/2016 | Zhang | G11C 16/3427 |
| | | | 365/185.02 |
| 2016/0179615 A1* | 6/2016 | Lee | G11C 29/52 |
| | | | 714/764 |
| 2016/0260493 A1* | 9/2016 | Kim | G11C 16/28 |
| 2016/0306693 A1* | 10/2016 | Lin | G06F 11/1048 |
| 2016/0378596 A1* | 12/2016 | Kim | H03M 13/293 |
| | | | 714/755 |

\* cited by examiner

DECODING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 105106303, filed on Mar. 2, 2016. The entirety of the above-mentioned patent application is hereby incorporated by reference herein and made a part of this specification.

BACKGROUND

Technical Field

The present invention relates to a decoding method, and more particularly, to a decoding method for a rewritable non-volatile memory module, and a memory control circuit unit and a memory storage apparatus using the same.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

Generally, data written to the rewritable non-volatile memory module is encoded according to an error correcting code, and data read from the rewritable non-volatile memory module is also decoded through a corresponding procedure. For example, when the error correcting code is implemented by using a turbo code algorithm in an iterative manner, the data is first divided into sub data units. Each of the sub data units is corresponding to a sub error correcting code, and the error correcting code corresponding to the data is constituted by those sub error correcting codes. However, a correcting capability of the sub error correcting code has its limit. The overall correcting capability may drop if a mis-correction occurs when the sub data units are decoded according to the sub error correcting codes. Accordingly, it is one of the major subjects for person skilled in the art as how to improve the correcting capability of the error correcting code in order to successfully decode the read data in order to obtain original data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a decoding method, a memory control circuit unit and a memory storage apparatus, which are capable of improving a decoding performance for the read data.

An exemplary embodiment provides a decoding method for a rewritable non-volatile memory module. The rewritable non-volatile memory module includes a plurality of memory cells. The method includes reading data from the memory cells according to a first voltage, wherein the data includes a user data string and an error checking and correcting code set, and the user data string includes a plurality of sub data units. The method also includes decoding at least part of the sub data units by a first decoding algorithm to obtain a plurality of decoded sub data units, wherein the decoded sub data units include a corrected bit, and a value of the corrected bit is decoded from an original bit value into a corrected bit value. The method further includes determining whether the corrected bit matches a reliability condition. The method further includes restoring the value of the corrected bit to the original bit value if the corrected bit matches the reliability condition.

An exemplary embodiment provides a memory control circuit unit for controlling a rewritable non-volatile memory module. The rewritable non-volatile memory module includes a plurality of memory cells. The memory control circuit unit includes a host interface, a memory interface, a memory management circuit and an error checking and correcting circuit. The host interface is coupled to a host system. The memory interface is coupled to the rewritable non-volatile memory module. The memory management circuit is coupled to the host interface and the memory interface. The error checking and correcting circuit is coupled to the memory management circuit. The memory management circuit sends a read command sequence for reading data from the memory cells according to a first voltage, wherein the data includes a user data string and an error checking and correcting code set, and the user data string includes a plurality of sub data units. The error checking and correcting circuit decodes at least part of the sub data units by a first decoding algorithm to obtain a plurality of decoded sub data units, wherein the decoded sub data units include a corrected bit, and a value of the corrected bit is decoded from an original bit value into a corrected bit value. The error checking and correcting circuit determines whether the corrected bit matches a reliability condition. The error checking and correcting circuit restores the value of the corrected bit to the original bit value if the corrected bit matches the reliability condition.

An exemplary embodiment provides a memory storage apparatus, which includes a connection interface unit, a rewritable non-volatile memory module and a memory control circuit unit. The connection interface unit is configured to couple to a host system. The rewritable non-volatile memory module includes a plurality of memory cells. The memory control circuit unit is coupled to the connection interface unit and the rewritable non-volatile memory module. The memory control circuit unit sends a read command sequence for reading data from the memory cells according to a first voltage, wherein the data includes a user data string and an error checking and correcting code set, and the user data string includes a plurality of sub data units. The memory control circuit unit decodes at least part of the sub data units by a first decoding algorithm to obtain a plurality of decoded sub data units, wherein the decoded sub data units include a corrected bit, and a value of the corrected bit is decoded from an original bit value into a corrected bit value. The memory control circuit unit determines whether the corrected bit matches a reliability condition. The memory control circuit unit restores the value of the corrected bit to the original bit value if the corrected bit matches the reliability condition.

Based on the above, the decoding method, the memory control circuit unit and the memory storage apparatus are capable of determining the correctness of the corrected bit by checking whether the corrected data in the decoded data matches the reliability condition during the process of decoding. Further, if it fails to match the reliability condition, the value of the corrected bit is adjusted again to avoid the mis-correction. As a result, the overall correction capability for the data may be enhanced to improve the decoding performance.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
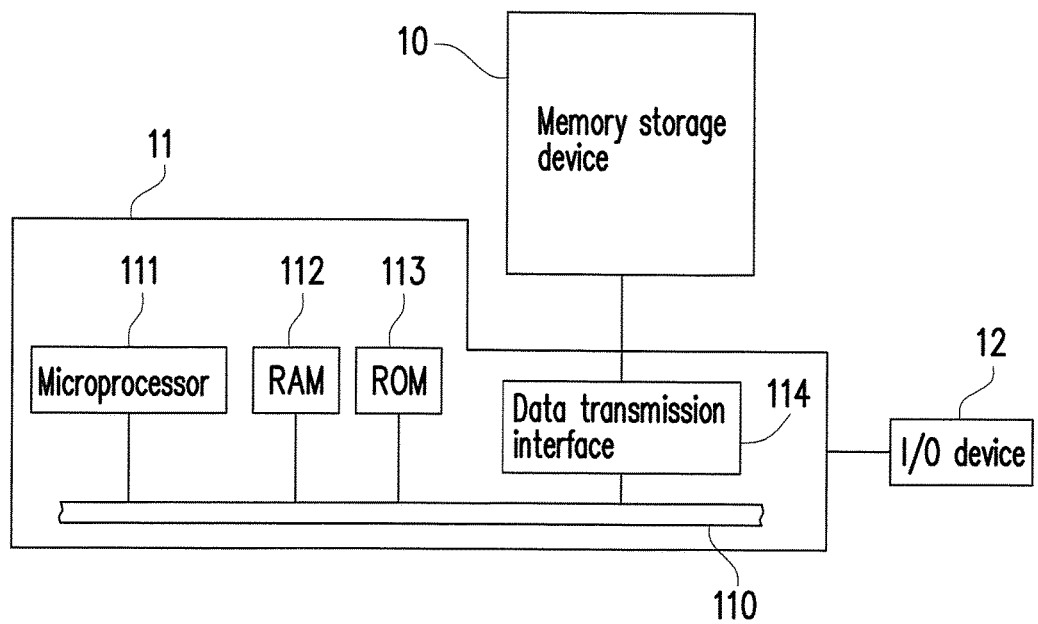
FIG. 1 is a schematic diagram illustrating a host system, a memory storage apparatus and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit unit). The memory storage apparatus is usually configured together with a host system so that the host system may write data into the memory storage apparatus or read data from the memory storage apparatus.

Figure 2:
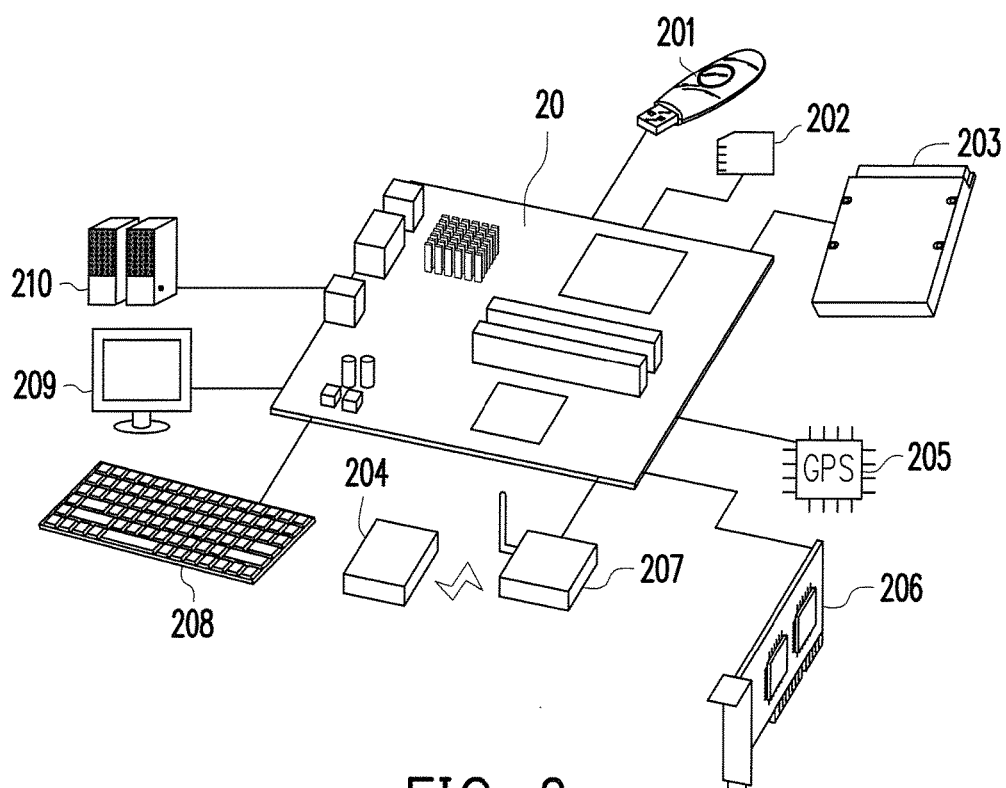
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to an exemplary embodiment, and FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 may write data into the memory storage apparatus 10 or read data from the memory storage apparatus 10 through the data transmission interface 114. Further, the host system 111 is coupled to an I/O device 12 through the system bus 110. For example, the host system 11 may transmit output signals to the I/O device 12 or receive input signals from I/O device 12 through the system bus 110.

In the present exemplary embodiment, the processor 111, the RAM 112, the ROM 113 and the data transmission interface 114 are disposed on a main board 20 of the host system 11. The number of the data transmission interface 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication Storage) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage device 204 through the wireless transmission device 207.

Figure 3:
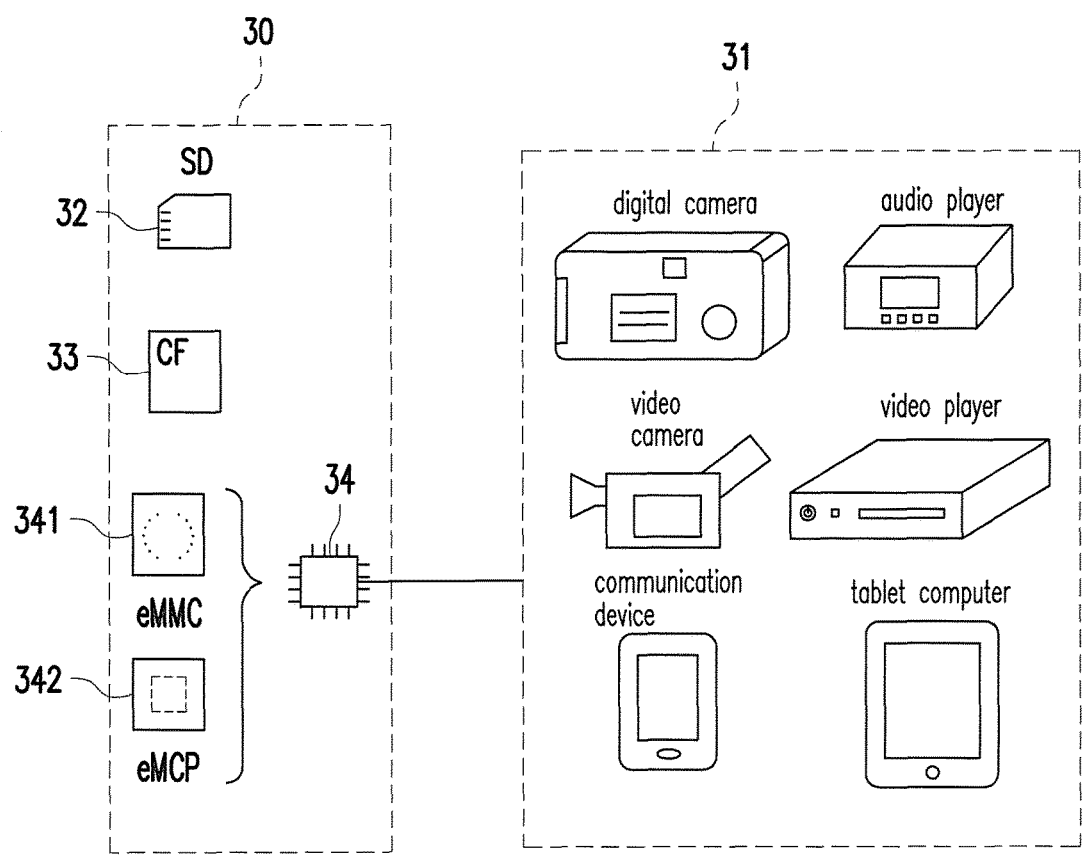
FIG. 3 is a schematic diagram illustrating a host system and a memory storage apparatus according to another exemplary embodiment.

In an exemplary embodiment, aforementioned host system may be any systems capable of substantially cooperating with the memory storage apparatus for storing data. The host system is illustrated as a computer system in foregoing exemplary embodiment; however, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
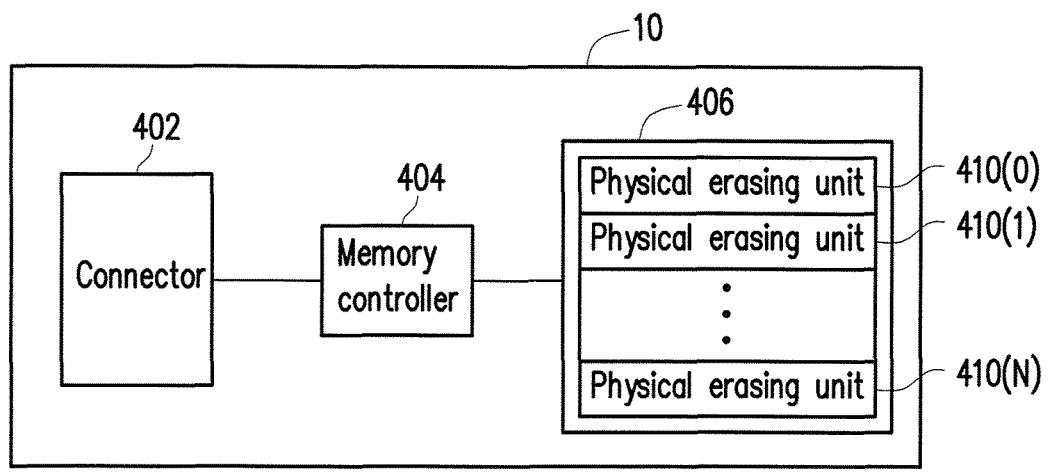
FIG. 4 is a schematic block diagram illustrating a host system and a memory storage apparatus according to an exemplary embodiment.

FIG. 4 is a schematic block diagram illustrating a host system and a memory storage apparatus according to an exemplary embodiment.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a SD (Secure Digital) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control instructions which are implemented in form of hardware or firmware, so as to execute operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes multiple physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Nevertheless, it should be understood that the invention is not limited thereto. Each physical erasing unit is composed by 64 physical programming units, 256 physical programming units or any number of the physical programming units.

In the present exemplary embodiment, the memory cells of the rewritable non-volatile memory module 406 constitute a plurality of physical programming units, and the physical programming units constitute a plurality of physical erasing units. Particularly, the memory cells on the same word line constitute one or more of the physical programming units.

More specifically, the physical erasing unit is the minimum unit for erasing. Namely, each physical erasing unit contains the least number of memory cells to be erased together. The physical programming unit is the minimum unit for programming. That is, the programming unit is the minimum unit for writing data. Each physical programming unit usually includes a data bit area and a redundancy bit area. The data bit area contains multiple physical access addresses for storing user data, and the redundant bit area is used to store system data (e.g., control information and error checking and correcting code). In the present exemplary embodiment, each data bit area of the physical programming unit contains 8 physical access addresses, and the size of each physical access address is 512 byte. However, in other exemplary embodiments, the data bit area may also contain more or less physical access addresses, and the number and size of the physical access addresses are not limited by the present invention. For example, in one exemplary embodiment, the physical erasing unit is a physical block, and the physical programming unit is a physical page or a physical sector, but the invention is not limited thereto.

In the present exemplary embodiment, the rewritable non-volatile memory module 406 is a MLC (Multi Level Cell) NAND flash memory module (i.e., a flash memory module capable of storing two data bits in one memory cell). However, the disclosure is not limited thereto. The rewritable non-volatile memory module 406 may also be a SLC (Single Level Cell) NAND flash memory module, (i.e., a flash memory module capable of storing one data bit in one memory cell), a TLC (Trinary Level Cell) NAND flash memory module (i.e., a flash memory module capable of storing three data bits in one memory cell), other flash memory modules or any memory module having the same features.

Each of the memory cells in the rewritable non-volatile memory module 406 is capable of storing one or more bits (or digits) by changing a threshold voltage of the memory cell. Particularly, one charge storage layer is provided between a control gate and a channel in each of the memory cells. The voltage of the memory cell may be further changed by applying a write voltage to the control gate for changing the number of the electrons in the charge storage layer. This process of changing the voltage is also known as "writing data into the memory cell" or "programming the memory cell". Each of the memory cells in the rewritable non-volatile memory module 406 may have a plurality of storage types (hereinafter, also known as states) according to the changing threshold voltage. Further, the storage state of the memory cell may be read by applying a read voltage, so as to obtain the data stored in the memory cell. In the present exemplary embodiment, the charge storage layer of the memory cell may also refer to a floating gate or a charge trapping layer.

Figure 5:
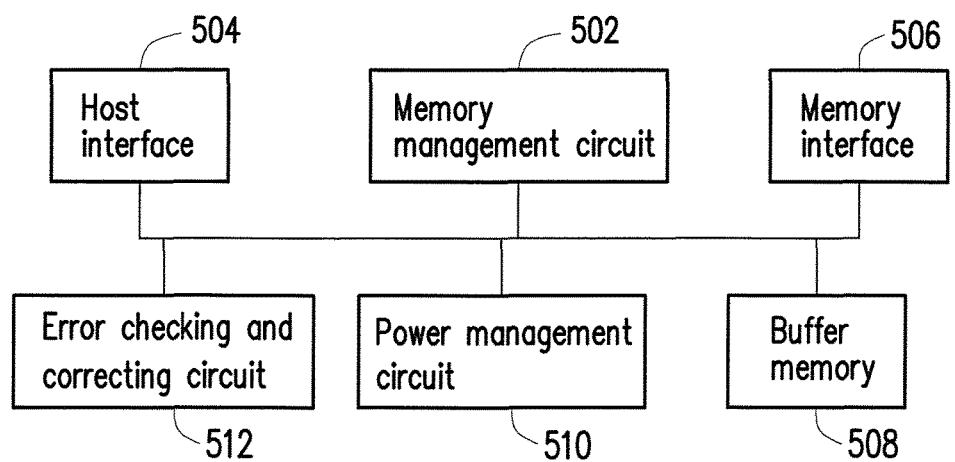
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 404 includes a memory management circuit 502, a host interface 504, a memory interface 506, a buffer memory 508, a power management circuit 510, and an error checking and correcting circuit 512.

The memory management circuit 502 is configured to control overall operations of the memory control circuit unit 404. Specifically, the memory management circuit 502 has a plurality of control instructions. During operations of the memory storage apparatus 10, the control instructions are executed to perform various operations such as writing, reading and erasing data.

In the present exemplary embodiment, the control instructions of the memory management circuit 502 are implemented in form of firmware. For instance, the memory management circuit 502 has a microprocessor unit (not illustrated) and a read-only memory (not illustrated), and the control instructions are burnt into the read-only memory. When the memory storage apparatus 10 operates, the control instructions are executed by the microprocessor to perform operations of writing, reading or erasing data.

In another exemplary embodiment of the invention, the control instructions of the memory management circuit 502 may also be stored, in form of program codes, into a specific area (e.g., a system area in the memory module exclusively used for storing the system data) of the rewritable non-volatile memory module 406. In addition, the memory management circuit 502 has a microprocessor unit (not illustrated), a ROM (not illustrated) and a RAM (not illustrated). Particularly, the ROM has an activate code, which is executed by the microprocessor unit to load the control instructions stored in the rewritable non-volatile memory module 406 into the RAM of the memory management circuit 502 when the memory control circuit unit 404 is enabled. Later, the control instructions are executed by the microprocessor unit to perform operations of writing, reading or erasing data.

Further, in another exemplary embodiment of the invention, the control instructions of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 406; the memory writing circuit is configured to issue a write command to the rewritable non-volatile memory module 406 in order to write data into the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written to the rewritable non-volatile memory module 406 and the data to be read from the rewritable non-volatile memory module 406.

The host interface 504 is coupled to the memory management circuit 502 and configured to couple to the connection interface unit 402, so as to receive and identify the commands and the data sent from the host system 11. In other words, the commands and the data sent from the host system 11 are sent to the memory management circuit 502 through the host interface 504. In the present exemplary embodiment, the host interface 504 is compatible with the SATA standard. However, it should be understood that the present invention is not limited thereto, and the host interface 504 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 506 is coupled to the memory management circuit 502 and configured to access the rewritable non-volatile memory module 406. That is, data to be written to the rewritable non-volatile memory module 406 is converted to a format acceptable by the rewritable non-volatile memory module 406 through the memory interface 506.

The buffer memory 508 is coupled to the memory management circuit 502 and configured to temporarily store data and commands from the host system 11 or data from the rewritable non-volatile memory module 406.

The power management unit 510 is coupled to the memory management circuit 502 and configured to control a power of the memory storage apparatus 10.

The error checking and correcting circuit 512 is coupled to the memory management circuit 502 and configured to execute an error checking and correcting procedure to ensure the correctness of data. Specifically, when the memory management circuit 502 receives a write command from the host system 11, the error checking and correcting circuit 512 generates an ECC code (Error Checking and Correcting Code) for the data corresponding to the write command, and the memory management circuit 502 writes the data and the ECC code corresponding to the write command into the rewritable non-volatile memory module 406. Later, when the memory management circuit 502 reads the data from the rewritable non-volatile memory module 406, the error checking and correcting code corresponding to the data is also read, and the error checking and correcting circuit 512 may perform the error checking and correcting procedure for the read data according to the error checking and correcting code.

Figure 6:
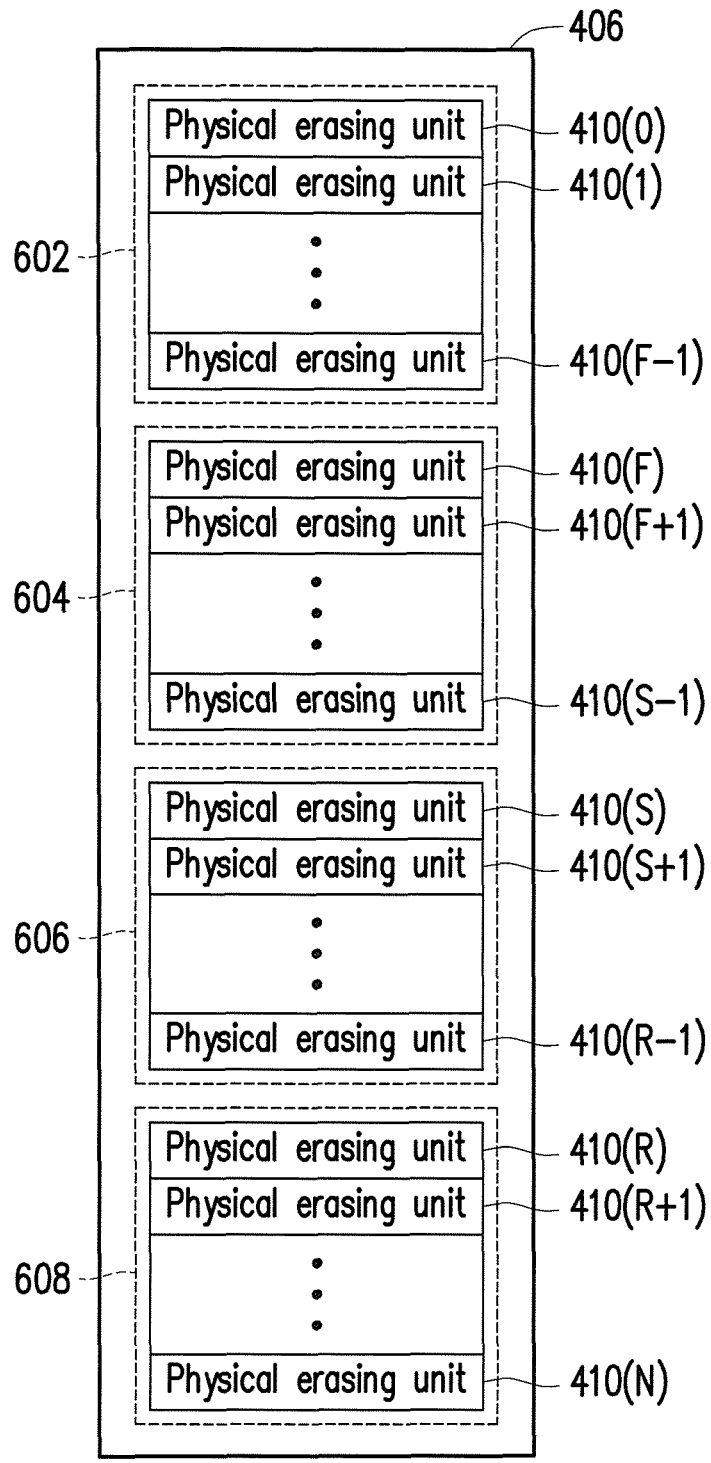
FIG. 6 and FIG. 7 are schematic diagrams illustrating a management of the physical erasing units according to an exemplary embodiment.
Figure 7:
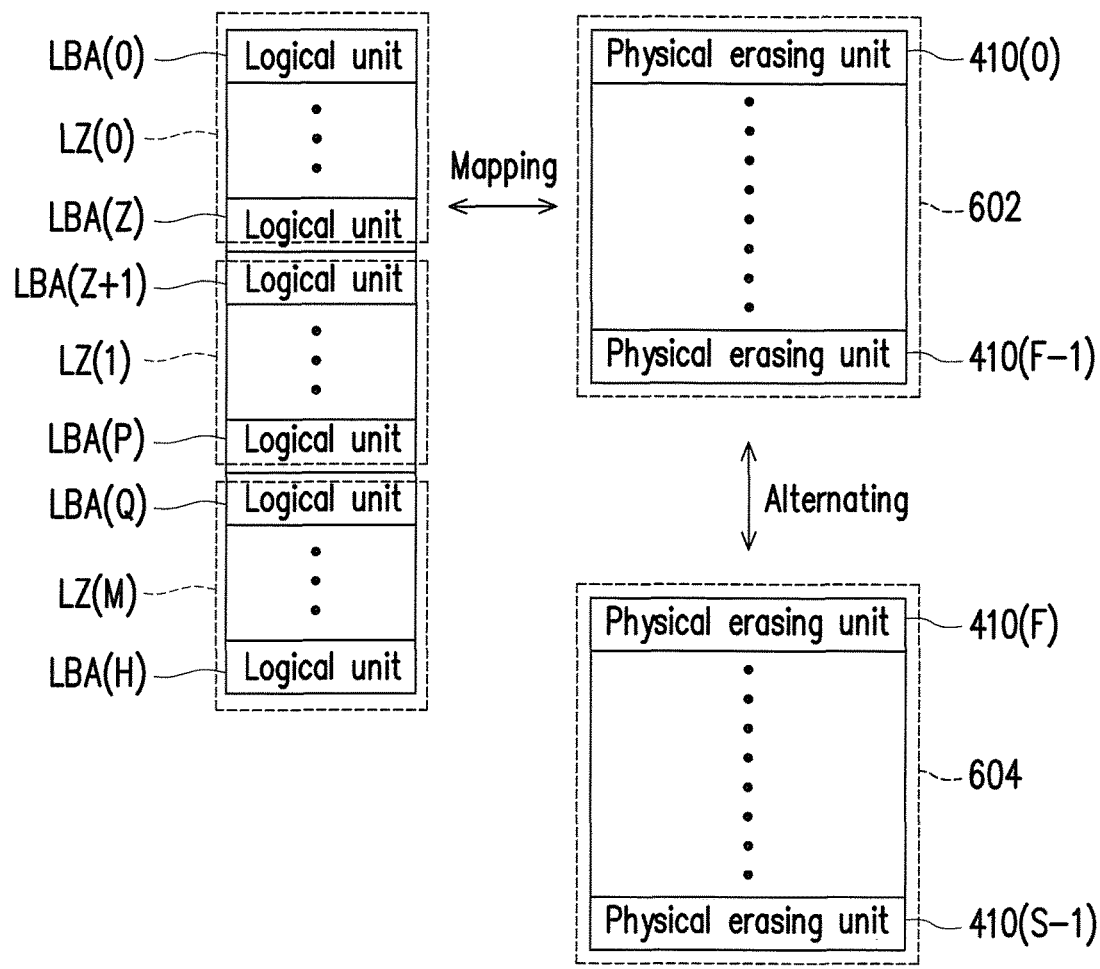

FIG. 6 and FIG. 7 are schematic diagrams illustrating a management of the physical erasing units according to an exemplary embodiment.

It should be understood that terms, such as "get", "select", "retrieve", "group", "divide", "associate" and so forth, are logical concepts which describe operations in the physical erasing units of the rewritable non-volatiles memory module 406. That is, the physical erasing units of the rewritable non-volatile memory module are logically operated, but actual positions of the physical units of the rewritable non-volatile memory module are not changed.

Referring to FIG. 6, the memory control circuit unit 404 (or the memory management circuit 502) may logically group the physical erasing units 410(0) to 410(N) into a data area 602, a spare area 604, a system area 606 and a replacement area 608.

The physical erasing units logically belonging to the data area 602 and the spare area 604 are configured to store data from the host system 11. More specifically, the physical erasing units of the data area 602 are regarded as the physical erasing units stored with the data, whereas the physical erasing units of the spare area 604 are configured to replace the physical erasing units of the data area 602. In other words, when the write command and the data to be written are received from the host system 11, the memory management unit 502 selects the physical erasing units from the spare area 604, and writes the data into the retrieved physical erasing units as the replacement of the physical erasing units in the data area 602.

The physical erasing units logically belonging to the system area 606 are configured to record system data. For example, the system data includes information related to manufacturer and model of the rewritable non-volatile memory module, the number of physical erasing units in the rewritable non-volatile memory module, the number of the physical programming units in each physical erasing unit, and so forth.

The physical erasing units logically belonging to the replacement area 608 are used in a bad physical erasing unit replacement procedure for replacing damaged physical erasing units. More specifically, if the replacement area 608 still includes normal physical erasing units when the physical erasing units of the data area 602 are damaged, the memory management circuit 502 gets the normal physical erasing units from the replacement area 608 for replacing the damaged physical erasing units.

Particularly, the numbers of the physical erasing units in the data area 602, the spare area 604, the system area 606 and the replacement area 608 may be different from one another according to the different memory specifications. In addition, it should be understood that, when the memory storage apparatus 10 operates, grouping relations of the physical erasing units for associating with the data area 602, the spare area 604, the system area 606, and the replacement area 608 are dynamically changed. For example, when the damaged physical erasing units in the spare area 604 are replaced by the physical erasing units in the replacement area 608, the physical erasing units originally from the replacement area 608 are then associated with the spare area 604.

Referring to FIG. 7, the memory control circuit unit 404 (or the memory management circuit 502) is configured with logical units LBA(0) to LBA(H) for mapping the physical erasing units of the data area 602, wherein each of the logical units includes a plurality of logical sub units for mapping to the corresponding physical programming units of the physical erasing units. Further, when the host system 11 intends to write the data into the logical units or update the data stored in the logical units, the memory control circuit unit 404 (or the memory management circuit 502) selects one physical erasing units from the spare area 604 for writing the data as alternate of the physical erasing units of the data area 602. In the present exemplary embodiment, the logical sub units may be logical pages or logical sectors.

In order to identify the data of each logical unit being stored in which of the physical erasing units, the memory control circuit unit 404 (or the memory management circuit 502) may record the mapping relations between the logical units and the physical erasing units in the present exemplary embodiment. Further, when the host system 11 intends to access the data in the logical sub unit, the memory control circuit unit 404 (or the memory management circuit 502) confirms the logical unit to which the logical sub unit belongs, and accesses the data in the physical erasing unit mapped to the logical unit. For instance, in the present exemplary embodiment, the memory control circuit unit 404 (or the memory management circuit 502) may store a logical address-physical address mapping table into the rewritable non-volatile memory module 406 for recording the physical erasing units mapped to each of the logical units, and the logical address-physical address mapping table is loaded into the buffer memory 508 for maintenance when the memory control circuit unit 404 (or the memory management circuit 502) intends to the access the data.

It should be noted that, the buffer memory 508 is unable to store the mapping table recorded with the mapping relations of all the logical units. Therefore, in the present exemplary embodiment, the memory control circuit unit 404 (or the memory management circuit 502) groups the logical units LBA(0) to LBA(H) into a plurality of logical zones LZ(0) to LZ(M), and configures one logical address-physical address mapping table for each of the logical zones. In particular, when the memory control circuit unit 404 (or the memory management circuit 502) intends to update the mapping table for one specific logical unit, the logical address-physical address mapping table of the logical zone to which the logical unit belongs is correspondingly loaded into the buffer memory 508 for updating.

Figure 8:
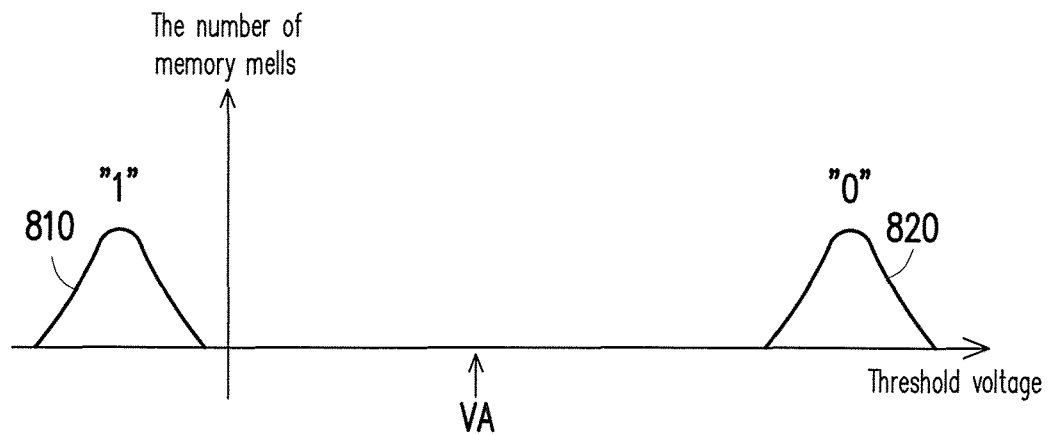
FIG. 8 is a schematic diagram illustrating threshold voltage distributions of the memory cells according to an exemplary embodiment of the invention.

FIG. 8 is a schematic diagram illustrating threshold voltage distributions of the memory cells according to an exemplary embodiment.

Referring to FIG. 8, after the data is written into a plurality of memory cells, the threshold voltage distribution of the memory cells includes two states 810 and 820. For instance, the state 810 having a lower threshold voltage peak value is configured to represent data "1", and the state 820 having a higher threshold voltage peak value is configured to represent data "0". The data stored in the memory cells may be obtained by applying a read voltage VA between the states 810 and 820 to the memory cells. For example, in response to the applied read voltage VA, the memory cell having the threshold voltage lower than the applied read voltage VA may be identified as storing the data "1", whereas another memory cell having the threshold voltage higher than the applied read voltage VA may be identified as storing the data "0". Nonetheless, in another exemplary embodiment, the state 810 may also be configured to represent the data "0" and the state 820 may also be configured to represent the data "1".

In the present exemplary embodiment, the memory cell including two states (e.g., the state 810 and state 820) may also be regarded as the memory cell operated in a two-level cell (2LC) mode (or also known as a 2LC programming mode). One memory cell that operated in the 2LC mode is configured to store data of one bit (e.g., the data "1" or the data "0").

Figure 9:
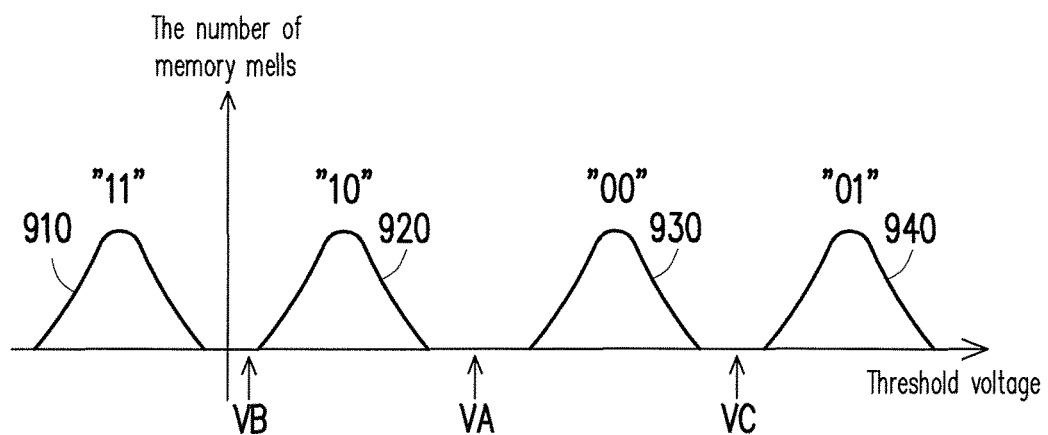
FIG. 9 is a schematic diagram illustrating threshold voltage distributions of the memory cells according to another exemplary embodiment of the invention.

FIG. 9 is a schematic diagram illustrating threshold voltage distributions of the memory cells according to another exemplary embodiment.

Referring to FIG. 9, after the data is written into a plurality of memory cells, the threshold voltage distributions of the memory cells include four states 910 to 940. The states 910 to 940 are configured to represent data "11", "10", "00" and "01" respectively. The data stored in the memory cells may be obtained by applying different read voltages VA to VC between the states 910 to 940 to the memory cells.

In the present exemplary embodiment, the memory cell including four states may also be regarded as the memory cell operated in a four-level cell (4LC) mode (or also known as a 4LC programming mode). One memory cell that operated in the 4LC mode is configured to store data of two bits. However, the data represented by each of the states 910 to 940 may be different based on different designs.

Figure 10:
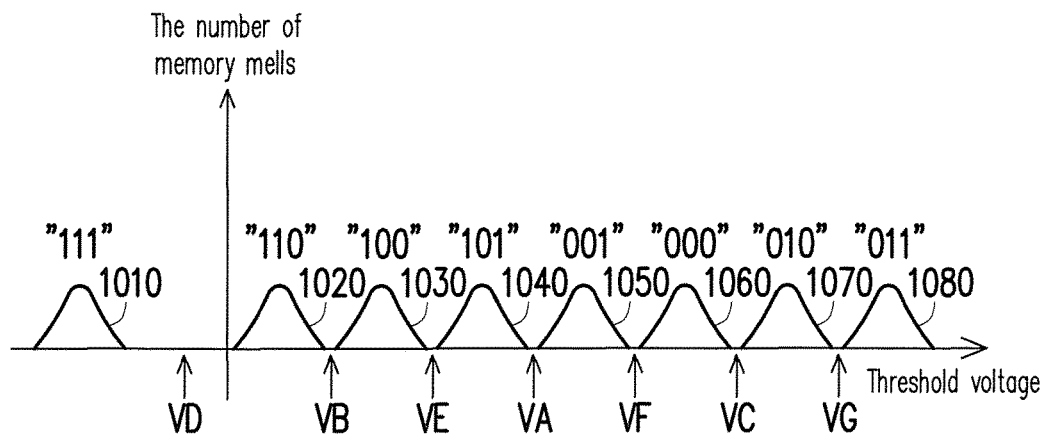
FIG. 10 is a schematic diagram illustrating threshold voltage distributions of the memory cells according to yet another exemplary embodiment of the invention.

FIG. 10 is a schematic diagram illustrating threshold voltage distributions of the memory cells according to yet another exemplary embodiment.

Referring to FIG. 10, after the data is written into a plurality of memory cells, the threshold voltage distributions of the memory cells include eight states 1010 to 1080. The states 1010 to 1080 are configured to represent data "111", "110", "100", "101", "001", "000", "010" and "011" respectively. The data stored in the memory cells may be obtained by applying different read voltages VA to VG between the states 1010 to 1080 to the memory cells. However, the data represented by each of the states 1010 to 1080 may be different based on different designs.

In the present exemplary embodiment, the memory cell including eight states may also be regarded as the memory cell that operated in an eight-level cell (8LC) mode (or also known as an 8LC programming mode). One memory cell that operated in the 8LC mode is configured to store data of three bits.

It should be noted that, in another exemplary embodiment, the number of the states of each memory cell may also be three, five, six, seven or more, which is not particularly limited by the invention. In other words, each of the memory cells may be operated in one specific-level cell mode. Herein, the specific-level cell mode may refer to a 2LC cell mode, a 3LC cell mode, a 4LC cell mode, a 5LC cell mode, a 6LC cell mode and so on. In the present exemplary embodiment, if one specific memory cell is operated in an M-level cell (MLC) mode, it indicates that the specific memory cell includes M number of states (or, M number of peaks). For example, M is a positive integer greater than 1.

Further, in the present exemplary embodiment, when the data is received by the memory control circuit unit 404 (or the memory management circuit 502), the memory control circuit unit 404 (or the memory management circuit 502) first divides the data into a plurality of sub data units. Then, the error checking and correcting circuit 512 performs an error correcting encoding operation on the sub data units to generate corresponding error correcting codes, and foil is an error checking and correcting code frame by encoding the sub data units and the error correcting codes. For example, a length of the data in each of the error checking and correcting code frame may be 4 KB (kilobyte), 2 KB, 1 KB or other size.

In the present exemplary embodiment, the memory control circuit unit 404 (or the memory management circuit 502) decodes the data on unit basis of the error checking and correcting code frame in order to read the data. For instance, it is assumed that the host system 11 sends a read command to the memory storage apparatus 10, wherein the read command instructs to read data from one specific logical address, and the data to be read are encoded into one error checking and correcting code frame. After the read command is received, the memory control circuit unit 404 (or the memory management circuit 502) sends a read command sequence to the rewritable non-volatile memory module 406, so as to read the data from the physical programming units mapped to the specific logical address, obtain a user data string from the read data, perform an error correcting decoding operation on the user data string to generate corresponding corrected data string, and send the corrected data string to the host system in response to the read command. It should be noted that, if the data to be read is encoded into two or more error checking and correcting code frames, the memory control circuit unit 404 (or the memory management circuit 502) reads each of the data strings corresponding to the error checking and correcting code frames, performs the error correcting decoding operation on the read data strings, merges the data strings into the corrected data string after successfully correcting the read data strings, and sends the corrected data string to the host system in response to the read command.

Particularly, in the present exemplary embodiment, the error checking and correcting circuit 512 uses a block turbo code (BTC) algorithm to perform the error correcting encoding/decoding operation. Detailed process of the block turbo code algorithm is described below with reference to the drawing.

Figure 11:
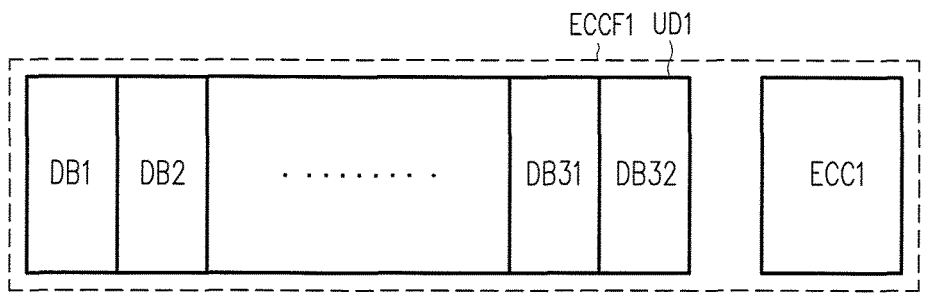
FIG. 11 is a schematic diagram illustrating an error checking and correcting code frame according to an exemplary embodiment.
Figure 12:
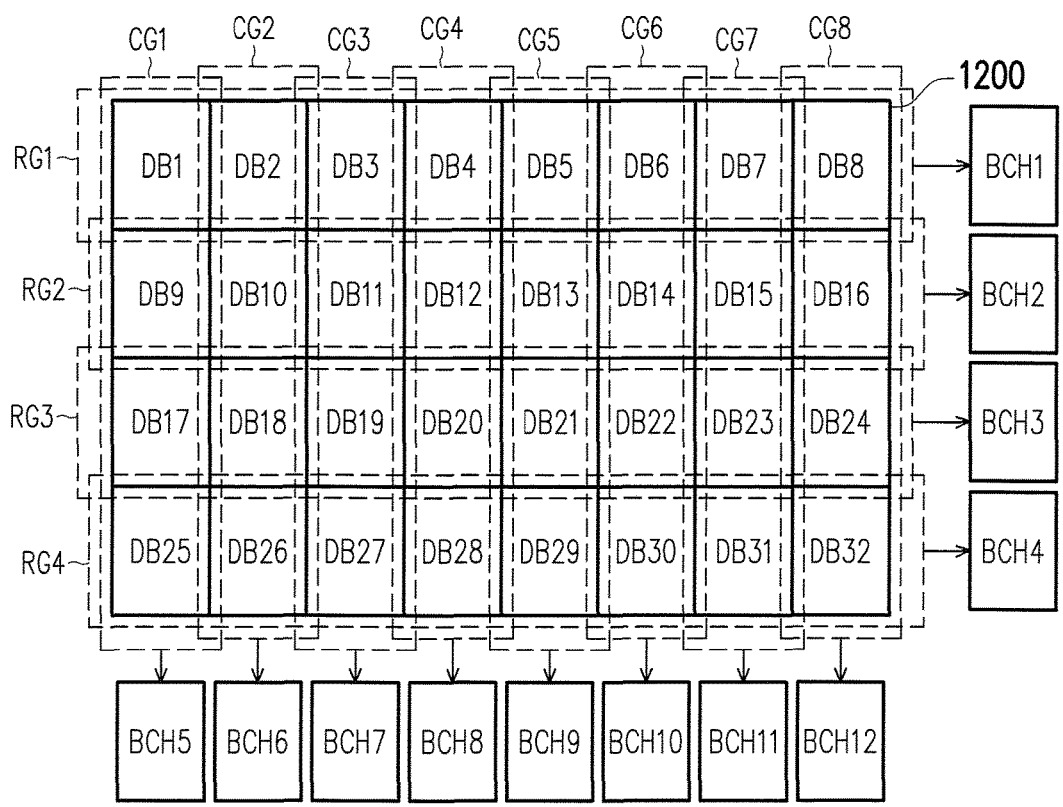
FIG. 12 is a schematic diagram illustrating the error correcting encoding operation using the block turbo code according to an exemplary embodiment.

FIG. 11 is a schematic diagram illustrating an error checking and correcting code frame according to an exemplary embodiment of the invention, and FIG. 12 is a schematic diagram illustrating the error correcting encoding operation using the block turbo code according to an exemplary embodiment. It should be understood that terms, such as "select", "divide", "group", "associate", "arrange" and so forth, are logical concepts which describe operations of the error checking and correcting circuit 512 for the data. That is to say, a storage position of the data processed by the error checking and correcting circuit 512 is not changed, and instead, the operations are logically performed on the data.

Referring to FIG. 11 and FIG. 12, the error checking and correcting circuit 512 performs the error correcting encoding operation on a data string UD1 to generate an error checking and correcting code set ECC1. Herein, an error checking and correcting code frame ECCF1 is formed by the error checking and correcting code set ECC1 together with the data string UD1 and programmed into the physical programming units of the rewritable non-volatile memory module 406. As described above, in the present exemplary embodiment, the error checking and correcting circuit 512 uses the block turbo code (BTC) algorithm to perform the error correcting encoding/decoding operation on the data string UD1. During the process of performing the block turbo code algorithm, the error checking and correcting circuit 512 divides the data string UD1 into a plurality of sub data units, arranges the divided sub data units in form of a matrix, generates column error correcting codes and row error correcting codes respectively corresponding to the sub data units arranged in form of the matrix, and merges the generated column error correcting codes and row error correcting codes to form the error checking and correcting code set ECC1.

For instance, first of all, the error checking and correcting circuit 512 divides the data string UD1 into a plurality of sub data units DB1 to DB32. It should be noted that, in the present exemplary embodiment, for clarity of the description, each of the sub data units contains data of one byte (i.e., data of eight bits), but the present invention is not limited thereto. For example, in other embodiments, each of the sub data units may also contain data of more than one byte.

Subsequently, the error checking and correcting circuit 512 arranges the sub data units DB1 to DB32 into a two dimensional (in horizontal and vertical directions) data matrix of 8×4, and groups the sub data units into a plurality of column data segments (also known as first direction data segments) and a plurality of row data segments (also known as second direction data segments) according to the dimensions. It is worth mentioning that, the first direction and the second direction used for describing the data segments and the error correcting codes as presented in the following disclosure merely means to distinguish the data segments and the error correcting codes corresponding to the sub data units arranged in different directions, rather than to limit the invention. That is to say, the first direction may also be used to describe the row direction of the matrix and the second direction may also be used to describe the column direction of the matrix. For example, the horizontally arranged sub data units DB1 to DB8 are grouped into a row data segment RG1; the sub data units DB9 to DB16 are grouped into a row data segment RG2; the sub data units DB17 to DB24 are grouped into a row data segment RG3; the sub data units DB25 to DB32 are grouped into a row data segment RG4; Further, the vertically arranged sub data units DB1, DB9, DB17 and DB25 are grouped into a column data segment CG1; the sub data units DB2, DB10, DB18 and DB26 are grouped into a column data segment CG2; the sub data units DB3, DB11, DB19 and DB27 are grouped into a column data segment CG3; the sub data units DB4, DB12, DB20 and DB28 are grouped into a column data segment CG4; the sub data units DB5, DB13, DB21 and DB29 are grouped into a column data segment CG5; the sub data units DB6, DB14, DB22 and DB30 are grouped into a column data segment CG6; the sub data units DB7, DB15, DB23 and DB31 are grouped into a column data segment CG7; the sub data units DB8, DB15, DB24 and DB32 are grouped into a column data segment CG8.

In the present exemplary embodiment, after grouping the sub data units DB1 to DB32 into the horizontal row data segments RG1 to RG4 and the vertical column data segments CG1 to CG8, the error checking and correcting circuit 512 uses an encoding algorithm (hereinafter, also known as a first encoding algorithm) as an auxiliary encoding algorithm to encode those sub data units, so as to generate the error correcting codes corresponding to the row data segments and the column data segments. In other words, for the horizontal row data segments RG1 to RG4, the error checking and correcting circuit 512 generates a row error correcting code BCH1 corresponding to the row data segment RG1 by encoding the data (i.e., the sub data units DB1 to DB8) grouped to the row data segment RG1 with the BCH algorithm. By analogy, the error checking and correcting circuit 512 generates a row error correcting code BCH2 corresponding to the row data segment RG2; generates a row error correcting code BCH3 corresponding to the row data segment RG3; and generates a row error correcting code BCH4 corresponding to the row data segment RG4. Further, for the vertical columns data segments CG1 to CG8, the error checking and correcting circuit 512 also generates a column error correcting code BCH5 corresponding to the column data segment CG1; generates a column error correcting code BCH6 corresponding to the column data segment CG2; generates a column error correcting code BCH7 corresponding to the column data segment CG3; generates a column error correcting code BCH8 corresponding to the column data segment CG4; generates a column error correcting code BCH9 corresponding to the column data segment CG5; generates a column error correcting code BCH10 corresponding to the column data segment CG6; generates a column error correcting code BCH11 corresponding to the column data segment CG7; and generates a column error correcting code BCH12 corresponding to the column data segment CG8. Accordingly, the data in the row data segments RG1 to RG4 and the column data segments CG1 to CG8 may be protected by the corresponding row error correcting codes BCH1 to BCH4 and the corresponding column error correcting codes BCH5 to BCH12 respectively. Further, it should be understood that, in the present exemplary embodiment, the row data segments and the column data segments are disclosed as being encoded by using the same auxiliary encoding algorithm, but the invention is not limited thereto. For example, in another exemplary embodiment, the error checking and correcting circuit 512 may use the first encoding algorithm to encode the row data segments and use a second encoding algorithm to encode the column data segments. For example, each of the first encoding algorithm and the second encoding algorithm may be a bose-chaudhuri-hocquenghem code (also known as BCH) encoding algorithm, a low density parity code encoding algorithm or other suitable encoding algorithms.

It is worth mentioning that, in the present exemplary embodiment, the error checking and correcting circuit 512 first groups the sub data units into the column data segments and the row data segments before encoding each of the column data segments and the row data segments to generate the column error correcting codes and the row error correcting codes respectively corresponding to the column data segments and the row data segments, but the present invention is not limited thereto. For example, in another exemplary embodiment, it is also possible that the error checking and correcting circuit 512 does not group the sub data units into the column data segments and the row data segments first but directly performs the error correcting encoding operation on the sub data units according to an arrangement of the sub data units. For instance, the error checking and correcting circuit 512 may directly perform the error correcting encoding operation on the sub data units DB1 to DB8 to generate the row error correcting code BCH1 corresponding to the sub data units DB1 to DB8. Further, in the present exemplary embodiment, a correction capability of the row error correcting code is better than a correction capability of the column error correcting code. In other words, a maximum number of correctable error bits of the row error correcting code may be greater than a maximum number of correctable error bits of the column error correcting code. However, the invention is not limited thereto. In other exemplary embodiments, the maximum number of correctable error bits of the column error correcting code may also be greater than the maximum number of correctable error bits of the row error correcting code.

Referring to FIG. 11, in the present exemplary embodiment, the error checking and correcting circuit 512 merges the row error correcting codes BCH1 to BCH4 and the column error correcting codes BCH5 to BCH12 into the error checking and correcting code set ECC1, and stores the error checking and correcting code frame ECCF1 containing the data string UD1 (i.e., the sub data units DB1 to DB32) and the error checking and correcting code set ECC1 into the rewritable non-volatile memory module 406. Later, after reading the error checking and correcting code frame ECCF1 from the rewritable non-volatile memory module 406, the memory control circuit unit 404 (or the memory management circuit 502) may use the error checking and correcting code set ECC1 to perform an error correcting decoding operation on the data string read by the error checking and correcting code frame ECCF1 to obtain the correct data string UD1.

For instance, when the read command is received from the host system, the memory control circuit unit 404 (or the memory management circuit 502) reads the corresponding error checking and correcting code frame ECCF1 from the physical programming units of the rewritable non-volatile memory module 406 according to the read command and obtains the uncorrected data string UD1 and the corresponding error checking and correcting code set ECC1. Next, the error checking and correcting circuit 512 performs the corresponding error correcting decoding operation to divide the uncorrected data string UD1 into 32 sub data units DB1 to DB32, arranges the sub data units DB1 to DB32 into a two dimensional data matrix 1200, and obtains the column error correcting codes BCH5 to BCH12 corresponding to the column data segments and the row correcting codes BCH1 to BCH4 corresponding to the row data segments from the error checking and correcting code set ECC1. Then, the error checking and correcting circuit 512 uses the corresponding column error correcting code to decode each of the column data segments by using the corresponding decoding algorithm and uses the corresponding row error correcting code to decode each of the row data segments by using the corresponding decoding algorithm. Herein, the corresponding decoding algorithms are a first decoding algorithm and a second decoding algorithm which are respectively corresponding to aforesaid first encoding algorithm and aforesaid second encoding algorithm. Herein, each of the first decoding algorithm and the second decoding algorithm may be a BCH decoding algorithm, a low density parity code decoding algorithm or other suitable decoding algorithms. For example, the error checking and correcting circuit 512 first decodes the row data segments formed by the horizontally arranged sub data units according to the row error correcting codes corresponding to the row data segments. That is to say, the error checking and correcting circuit 512 uses the row error correcting code BCH1 to decode the sub data units DB1 to DB8; uses the row error correcting code BCH2 to decode the sub data units DB9 to DB16; uses the row error correcting code BCH3 to decode the sub data units DB17 to DB24; and uses the row error correcting code BCH4 to decode the sub data units DB25 to DB32. If uncorrectable sub data units exist among the sub data units DB1 to DB32 after a first horizontal decoding is performed, the error checking and correcting circuit 512 then performs a first vertical decoding on the data of the column data segments containing the uncorrectable sub data units according to the column error correcting codes corresponding to the column data segments. For example, the error checking and correcting circuit 512 uses the column error correcting code BCH5 to decode the sub data units DB1, DB9, DB17 and DB25; or uses the column error correcting code BCH6 to decode the sub data units DB2, DB10, DB18 and DB26; or uses the column error correcting code BCH7 to decode the sub data units DB3, DB11, DB19 and DB27; or uses the column error correcting code BCH8 to decode the sub data units DB4, DB12, DB20 and DB28; or uses the column error correcting code BCH9 to decode the sub data units DB5, DB13, DB21 and DB29; or uses the column error correcting code BCH10 to decode the sub data units DB6, DB14, DB22 and DB30; or uses the column error correcting code BCH11 to decode the sub data units DB7, DB15, DB23 and DB31; or uses the column error correcting code BCH12 to decode the sub data units DB8, DB16, DB24 and DB32. After the first vertical decoding is performed, the error checking and correcting circuit 512 performs a horizontal decoding (i.e., a second horizontal decoding) again followed by performing a vertical decoding (i.e., a second vertical decoding) again in the same manner, and this process will repeat until all the sub data units are corrected or a decoding termination condition is satisfied (e.g., an iteration count reaches or exceeds a preset count). Since part of the uncorrectable sub data units in the previous horizontal decoding may be corrected in the current vertical decoding, the number of the originally uncorrectable sub data units being corrected may increase in the next horizontal decoding. Accordingly, by using the horizontal and vertical iteration decodings, the user data in the error checking and correcting code frame may be decoded rapidly to generate the corrected user data.

It is worth mentioning that, during the iterative process of the BTC algorithm, when the number of error bits in one sub data unit is not greater than a correctable upper limit value (i.e., the maximum number of correctable error bits) of the error checking and correcting circuit 512, the data in that sub data unit may be corrected so as to obtain a decoded sub data unit. Accordingly, in the decoded sub data unit, the error bit in the sub data unit has been corrected into a corrected bit. Herein, a value of the bit read from the memory cell is an original bit value before the correction, and is adjusted to a corrected bit value after the correction. For example, if the maximum number of correctable error bits of the error checking and correcting circuit 512 is greater than 1 and one sub data unit has one error bit (i.e., the number of the error bits is 1), the error checking and correcting circuit 512 may correct such sub data unit by adjusting a value of that error bit. For example, the original bit value of one specific error bit is "1", and has the corrected bit value being "0" after being corrected into the corrected bit. However, it is possible that the error bit identified by the error checking and correcting circuit 512 is actually a correct bit. In this case, although the error checking and correcting circuit 512 may determine that the decoding is successful after changing the value of the identified error bit (which is actually the correct bit), the mis-correction in fact occurs since a value of the correct bit is changed but the bit where error really occurs is not corrected. To avoid the mis-correction, in the present exemplary embodiment, after decoding at least part of the sub data units in the user data string, the error checking and correcting circuit 512 checks whether the corrected bit in the decoded sub data units is the bit where error actually occurs.

In the present exemplary embodiment, the error checking and correcting circuit 512 determines a value of the corrected bit according to whether the corrected bit matches a reliability condition. If the corrected bit matches the reliability condition, the error checking and correcting circuit 512 determines that the value of the corrected bit is the original bit value, that is, a decoding result of the decoded sub data unit is ignored. For example, the error checking and correcting circuit 512 adjusts (i.e., restores) the value of the corrected bit in the decoded sub data unit to the original bit value. Otherwise, if the corrected bit does not match the reliability condition, the error checking and correcting circuit 512 determines that the value of the corrected bit is the corrected bit value, that is, the decoding result of the decoded sub data unit is adopted. In other words, the error checking and correcting circuit 512 no longer adjusts the value of the corrected bit in the decoded sub data units.

Specifically, the error checking and correcting circuit 512 determines whether the corrected bit matches the reliability condition according to whether a threshold voltage of the memory cell storing the corrected bit falls within a preset region. If the threshold voltage of the memory cell storing the corrected bit falls within the preset region, the error checking and correcting circuit 512 determines that the corrected bit does not match the reliability condition. Otherwise, if the threshold voltage of the memory cell storing the corrected bit falls outside the preset region (i.e., does not fall within the preset region), the error checking and correcting circuit 512 determines that the corrected bit matches the reliability condition.

The preset region is determined according a read voltage applied when reading data. In the present exemplary embodiment, the memory control circuit unit 404 (or the error checking and correcting circuit 512) determines the preset region according to the read voltage (hereinafter, also known as a first voltage) and a preset difference. For example, the memory control circuit unit 404 (or the memory management circuit 502) subtracts the preset difference from the read voltage to obtain one voltage (hereinafter, also known as a second voltage), and adds the preset difference to the read voltage to obtain another voltage (hereinafter, also known as a third voltage). Further, the memory control circuit unit 404 (or the error checking and correcting circuit 512) sets a voltage range between the second voltage and the third voltage as the preset region. However, the present invention is not intended to limit the method of determining the preset region. For example, in another exemplary embodiment, the preset region may also be determined in a table look up manner.

In addition, the memory control circuit unit 404 (or the error checking and correcting circuit 512) may set a different preset region for each iteration decoding of the BTC algorithm. For example, in the present exemplary embodiment, in a first iteration decoding, the memory control circuit unit 404 (or the error checking and correcting circuit 512) obtains one voltage range according to the read voltage and one preset difference (hereinafter, also known as a first preset difference) in order to set one preset region (hereinafter, also known as a first preset region). In a second iteration decoding, the memory control circuit unit 404 (or the error checking and correcting circuit 512) may obtain another voltage range according to the read voltage and another preset difference (hereinafter, also known as a second preset difference) which is different from the first preset difference in order to set another preset region (hereinafter, also known as a second preset region). For example, the first preset difference is less than the second preset difference so the voltage range corresponding to the first preset region is narrower and the voltage range corresponding to the second preset region is wider. However, in another exemplary embodiment, the first preset region and the second preset region may also be determined in a table look up manner. Herein, one iteration decoding of the BTC algorithm includes decoding once for each of the column data segments once and decoding once for each of the row data segments once. In one iteration decoding, if the uncorrectable bit no longer exists in the decoded data after decoding the data segments in one of the directions, it is not required to continuously decode the data segments in another one of the directions.

Figure 13A:
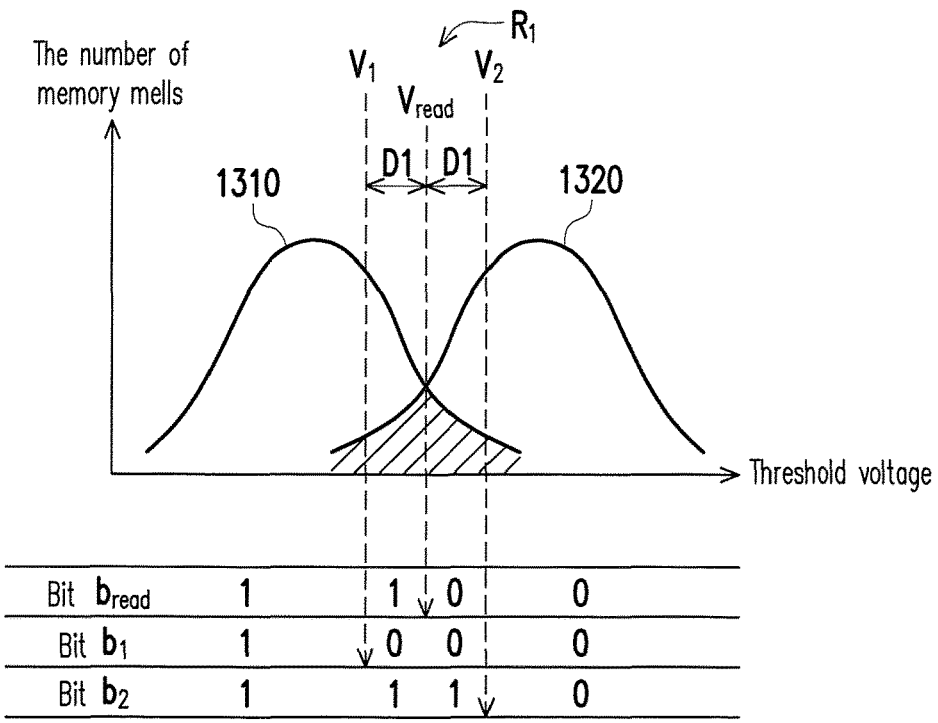
FIG. 13A and FIG. 13B illustrate schematic diagrams for setting the preset regions according to an exemplary embodiment.
Figure 13B:
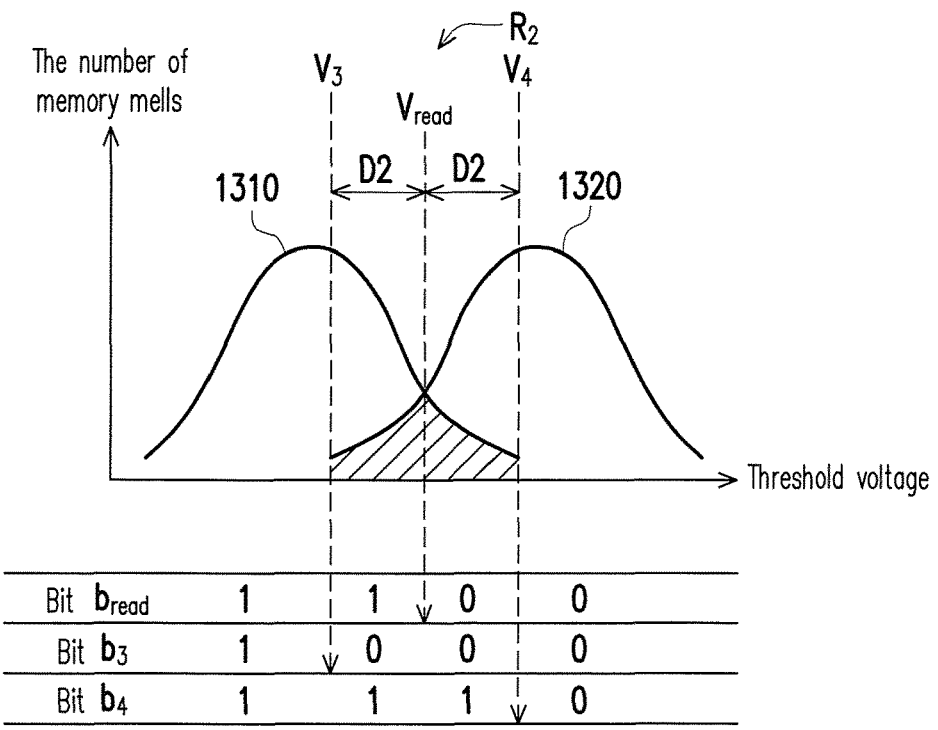

FIG. 13A and FIG. 13B illustrate schematic diagrams for setting the preset regions according to an exemplary embodiment. To simplify the description, the present exemplary embodiment is described by using one memory cell storing the data of one bit for example.

Referring to FIG. 13A and FIG. 13B, a horizontal axis represents the threshold voltage of the memory cell, and a vertical axis represents the number of the memory cells. For example, FIG. 13A and FIG. 13B each represents the threshold voltage of each of the memory cells on one specific word line. Herein, it is assumed that, when the threshold voltage of one specific memory cell falls within a distribution 1310, what stored by the specific memory cell is the bit "1". Conversely, when the threshold voltage of one specific memory cell falls in a distribution 1320, what stored by the memory specific cell is the bit "0". It is worth mentioning that, the present exemplary embodiment takes a SLC-type flash memory module for example, thus there are two possible distributions for the threshold voltages. However, in other exemplary embodiments, the threshold voltage may include four, eight or any number of possible distributions. In addition, the bit represented by each distribution is not particularly limited by the invention.

When it is intended to read the data from the rewritable non-volatile memory module 406, the memory control circuit unit 404 (or the memory management circuit 502) sends a read command sequence to the rewritable non-volatile memory module 406. The read command sequence includes one or more commands or program codes, and is configured to instruct for reading the physical programming unit composed of a plurality of memory cells according to the a read voltage $V_{read}$ in order to obtain a plurality of bits. If the threshold voltage of one specific memory cell is less than the read voltage $V_{read}$, the specific memory cell is turned on so the memory control circuit unit 404 (or the memory management circuit 502) reads the bit "1". Conversely, if the threshold voltage of one specific memory cell is greater than the read voltage $V_{read}$, the specific memory cell is not turned on so the memory control circuit unit 404 (or the memory management circuit 502) reads the bit "0". It should be noted that, the distribution 1310 and the distribution 1320 contain one overlapping region (marked by slash lines). The overlapping region represents that, some memory cells are suppose to store the bit "1" (which belongs to the distribution 1310) yet having the threshold voltage greater than the read voltage $V_{read}$; or, some memory cells are suppose to store the bit "0" (which belongs to the distribution 1320) yet having the threshold voltages less than the read voltage $V_{read}$. In other words, a part of bits among all the bits being read may have errors. In other words, if the threshold voltage of one memory cell falls within the overlapping region, the probability for error to occur on the bit stored by that memory cell is higher. Conversely, if the threshold voltage of one memory cell falls outside the overlapping region, the probability for error to occur on the bit stored by that memory cell is lower.

Referring to FIG. 13A, the memory control circuit unit 404 (or the error checking and correcting circuit 512) sets a preset region R1 according to the read voltage $V_{read}$ and a preset difference D1. Specifically, the memory control circuit unit 404 calculates for a voltage V1 and a voltage V2 by using the read voltage $V_{read}$ and the preset difference D1, and sets a voltage range between the voltage V1 and the voltage V2 as the preset region R1. When the threshold voltage of the memory cell storing the corrected bit falls within the preset region R1 (i.e., does not match the reliability condition), it indicates that the probability for error to occur on the bit stored by that memory cell is higher. Thus, it is highly possible that the corrected bit is the bit where error actually occurs so the error checking and correcting circuit 512 may determine that the value of this corrected bit is the corrected bit value. For example, after correcting the error bit in the sub data unit to obtain the decoded sub data unit, when the threshold voltage of the memory cell to which the corrected bit in the decoded sub data unit belongs falls within the preset region R1, the error checking and correcting circuit 512 keeps the value of the corrected bit (i.e., the corrected bit value) in the decoded sub data unit. However, when the threshold voltage of the memory cell storing the corrected bit falls outside the preset region R1 (i.e., matches the reliability condition), it indicates that the probability for error to occur on the bit stored by that memory cell is lower. Thus, it is highly possible that the corrected bit is actually the correct bit so the error checking and correcting circuit 512 may determine that the value of the corrected bit is the original bit value. For example, after correcting the error bit in the sub data unit to obtain the decoded sub data unit, when the threshold voltage of the memory cell to which the corrected bit in the decoded sub data unit belongs does not fall within the preset region R1, the error checking and correcting circuit 512 adjusts the value of the corrected bit in the decoded sub data unit to the original bit value. In other words, because the value of the corrected bit is restored to the original bit value before the correction, the sub data unit including the corrected bit is identified as not being successfully decoded.

Whether the threshold voltage of the memory cell falls within the preset region R1 may be determined according to the bit read from the memory cell. For example, referring to FIG. 13A, the preset region R1 is set according to the voltage V1 and the voltage V2. The memory control circuit unit 404 (or the memory management circuit 502) may apply the voltage V1 and the voltage V2 to read one specific memory cell in order to obtain a bit b1 and a bit b2, respectively. When the voltage V1 is applied, if the read bit b1 is "1", it indicates that the threshold voltage of the specific memory cell is less than the voltage V1; otherwise, if the read bit b1 is "0", it indicates that the threshold voltage of the specific memory cell is greater than the voltage V1. On the other hand, when the voltage V2 is applied, if the read bit b2 is "1", it indicates that the threshold voltage of the specific memory cell is less than the voltage V2; otherwise, if the read bit b2 is "0", it indicates that the threshold voltage of the specific memory cell is greater than the voltage V2. Therefore, as shown by FIG. 13A, because the read bit b1 is "0" when the voltage V1 is applied and the bit 2 is "1" when the voltage V2 is applied, the memory control circuit unit 404 (or the error checking and correcting circuit 512) may determine that the threshold voltage of the memory cell falls within the preset region R1.

If the sub data unit that is not successfully decoded still exists after one iteration decoding is performed, the error checking and correcting circuit 512 will perform the next iteration decoding. Referring to FIG. 13B, the memory control circuit unit 404 (or the error checking and correcting circuit 512) sets another preset region R2 according to the read voltage $V_{read}$ and a preset difference D2. The preset difference D2 may be greater than the preset difference D1. Therefore, the memory control circuit unit 404 calculates for a voltage V3 and a voltage V4 by using the read voltage $V_{read}$ and the preset difference D2, and sets a voltage range between the voltage V3 and the voltage V4 as the preset region R2. Further, the memory control circuit unit 404 (or the error checking and correcting circuit 512) determines whether the corrected bit matches the reliability condition according to the preset region R2 being set. Details regarding the determination method have been described in the exemplary embodiment of FIG. 13A, which are not repeated hereinafter.

Figure 14:
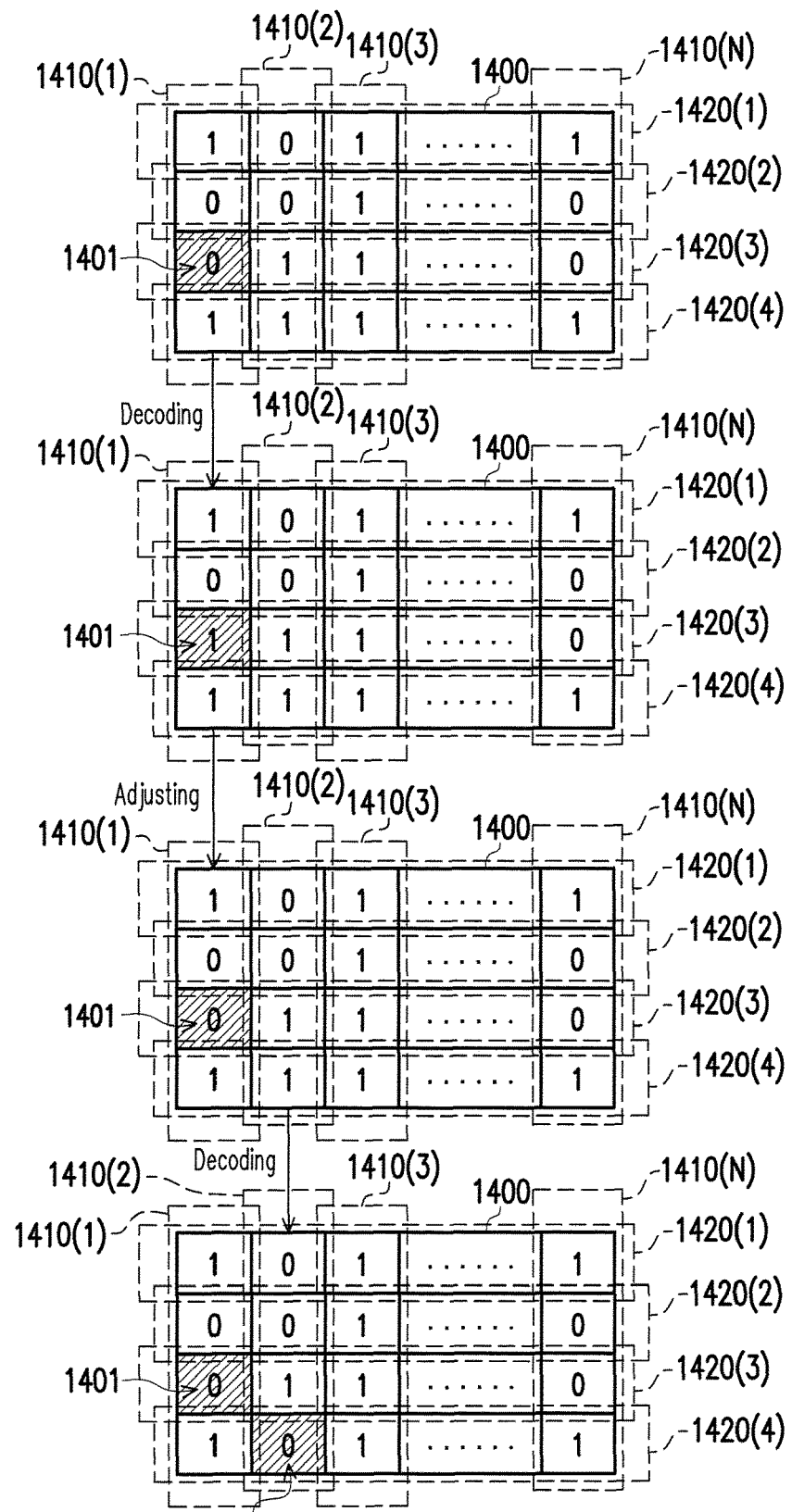
FIG. 14 illustrates a schematic diagram for adjusting the corrected bit according to the decoding result according to an exemplary embodiment.

FIG. 14 illustrates a schematic diagram for adjusting the corrected bit according to the decoding result according to an exemplary embodiment. In the present exemplary embodiment, the error correcting decoding operation is performed by using the BTC algorithm.

Referring to FIG. 14, when the read command is received from the host system, the memory control circuit unit 404 (or the memory management circuit 502) reads an uncorrected data string and a corresponding error checking and correcting code set from a plurality of memory cells by using a read voltage according to the read command. Next, the error checking and correcting circuit 512 performs the error correcting decoding operation to divide the uncorrected data string into a plurality of sub data units, and arranges the sub data units into a two dimensional data matrix 1400 to obtain a plurality of column data segments and a plurality of row data segments. For example, column data segments 1410(1) to 1410(N) and row data segments 1420(1) to 1420(4) may be formed by said sub data units. To simplify the description, in the present exemplary embodiment, one sub data unit only includes the data of one bit. However, in other exemplary embodiments, one sub data unit may include the data of more bits. Thereafter, the error checking and correcting circuit 512 decodes the column data segments and the row data segments respectively according to the column error correcting codes and the row error correcting codes of the error checking and correcting code set. For example, after decoding the column data segment 1410(1) and determining that error occurs on a bit 1401, the error checking and correcting circuit 512 may conduct the correction by changing a value of the bit 1401. In the present exemplary embodiment, the error checking and correcting circuit 512 changes the value of the bit 1401 of the column data segment 1410(1) from "0" (i.e., the original bit value) to "1" (i.e., the corrected bit value).

Referring to FIG. 14, for example, after performing the error correcting decoding operation on the column data segment 1410(1), the error checking and correcting circuit 512 determines whether a threshold voltage of the memory cell storing the bit 1401 falls within a preset region. In the present exemplary embodiment, it assumed that the threshold voltage of the memory cell storing the bit 1401 falls within a region outside the preset region, that is, the bit 1401 may not be the bit where error actually occurs. Accordingly, the error checking and correcting circuit 512 adjusts the bit 1401 again by changing the value of the bit 1401 again from "1" (i.e., the corrected bit value) to "0" (i.e., the original bit value). In other words, the error checking and correcting circuit 512 ignores the correction for the bit 1401 by changing the value of the bit 1401 again. Next, the error checking and correcting circuit 512 continues to decode the next column data segment 1410(2). At this time, the error checking and correcting circuit 512 determines that a bit 1402 in the data segment 1410(2) is the error bit, so that the correction is conducted by changing a value of the bit 1402. In the present exemplary embodiment, the error checking and correcting circuit 512 adjusts the value of the bit 1402 of the column data segment 1410(2) from "1" (i.e., the original bit value) to "0" (i.e., the corrected bit value). Then, the error checking and correcting circuit 512 determines whether a threshold voltage of the memory cell storing the bit 1402 falls within the preset region. In the present exemplary embodiment, it assumed that the threshold voltage of the memory cell storing the bit 1402 falls within the preset region, that is, the bit 1402 may be the bit where error actually occurs. Accordingly, the error checking and correcting circuit 512 keeps a correction result of the bit 1402, and continues to decode the next column data segment 1410(3). In the present exemplary embodiment, it is assumed that the error checking and correcting circuit 512 have decoded the row data segments first before decoding the column data segments. If each of the row data segments and each of the column data segments are decoded in this iteration decoding, since at least the column data segment 1410(1) includes the sub data unit that is not successfully decoded, the error checking and correcting circuit 512 continues to perform the next iteration decoding until all the sub data units are corrected or a decoding termination condition is satisfied (e.g., an iteration count reaches or exceeds a preset count).

In the present exemplary embodiment, the determination for the corrected bit is performed after each of the column data segments is decoded. However, in another exemplary embodiment, the determination for the corrected bit may also be performed after each of the row data segments is decoded. Furthermore, in yet another exemplary embodiment, the determination for the corrected bit may also be performed after each of the row data segments and each of the column data segments are decoded.

Figure 15:
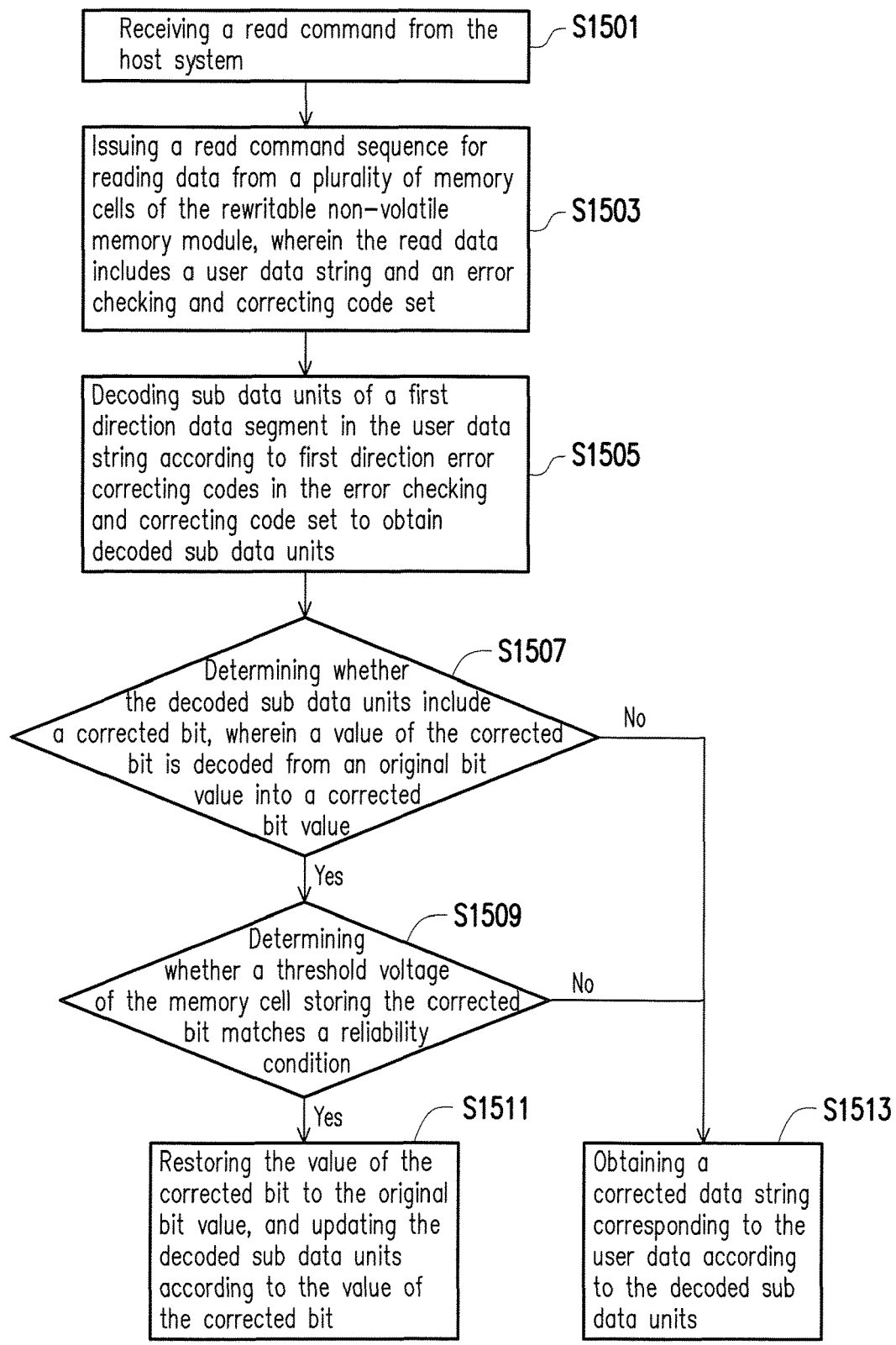
FIG. 15 is a flowchart illustrating a decoding method according to an exemplary embodiment.

FIG. 15 is a flowchart illustrating a decoding method according to an exemplary embodiment.

Referring to FIG. 15, in step S1501, the memory control circuit unit 404 (or the memory management circuit 502) receives a read command from the host system.

In step S1503, the memory control circuit unit 404 (or the memory management circuit 502) issues a read command sequence for reading data from a plurality of memory cells of the rewritable non-volatile memory module 406. Herein, the read data includes a user data string and an error checking and correcting code set.

In step S1505, the memory control circuit unit 404 (or the error checking and correcting circuit 512) decodes sub data units of a first direction data segment in the user data string according to first direction error correcting codes in the error checking and correcting code set to obtain decoded sub data units.

In step S1507, the memory control circuit unit 404 (or the error checking and correcting circuit 512) determines whether the decoded sub data units include a corrected bit. Herein, a value of the corrected bit is decoded from an original bit value into a corrected bit value.

If the corrected bit is included, in step S1509, the memory control circuit unit 404 (or the error checking and correcting circuit 512) determines whether a threshold voltage of the memory cell storing the corrected bit matches a reliability condition.

If the threshold voltage of the memory cell storing the corrected bit matches the reliability condition, in step S1511, the memory control circuit unit 404 (or the error checking and correcting circuit 512) restores the value of the corrected bit to the original bit value, and updates the decoded sub data units according to the value of the corrected bit.

If the corrected bit is not included as determined in step S1507, the memory control circuit unit 404 (or the error checking and correcting circuit 512) obtains a corrected data string corresponding to the user data string according to the decoded sub data units in step S1513. Accordingly, the memory control circuit unit 404 (or the memory management circuit 502) transmits the corrected data string to the host system.

After step S1511 is performed, the memory control circuit unit 404 (or the error checking and correcting circuit 512) decodes the sub data units of a second direction data segment in the user data string according to second direction error correcting codes in the error checking and correcting code set to obtain updated decoded sub data units. Moreover, aforesaid steps have been described in detail as the above, which is not repeated hereinafter.

In summary, when at least part of the read data is decoded and corrected in the invention, the possibility for the corrected bit to be the bit where error occurs may be determined by checking whether the corrected bit in the decoded sub data unit belongs to the preset region. When the corrected bit does not belong to the preset region, it is determined that the possibility for the corrected bit to be the bit where error occurs is lower, so that the corrected bit is adjusted again to restore the value of the corrected bit to the original bit value before the correction. As a result, the mis-correction may be avoided to further improve error correction capability for the read data.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a flash memory module having a plurality of memory cells, the decoding method comprising:
    reading data from the memory cells according to a first voltage, wherein the data comprises a user data string and an error checking and correcting code set, and the user data string comprises a plurality of sub data units;
    decoding at least part of the sub data units by a first decoding algorithm to obtain a plurality of decoded sub data units, wherein the decoded sub data units comprise a corrected bit, and a value of the corrected bit is decoded from an original bit value into a corrected bit value;
    determining whether the corrected bit matches a reliability condition;
    restoring the value of the corrected bit to the original bit value if the corrected bit matches the reliability condition; and
    determining a preset region according to the first voltage and a first preset difference;
    wherein the step of determining whether the corrected bit matches the reliability condition comprises:
    determining whether a threshold voltage of the memory cell storing the corrected bit falls within the preset region;
    determining that the corrected bit does not match the reliability condition if the threshold voltage of the memory cell storing the corrected bit falls within the preset region; and
    determining that the corrected bit matches the reliability condition if the threshold voltage of the memory cell storing the corrected bit does not fall within the preset region,
    wherein after the step of restoring the value of the corrected bit to the original bit value if the corrected bit matches the reliability condition, the decoding method further comprises:
    counting an iteration count;
    determining whether the iteration count reaches a preset count; and
    re-determining the preset region according to the first voltage and a second preset difference if the iteration count does not reach the preset count,
    wherein the second preset difference is greater than the first preset difference.

2. The decoding method of claim 1, further comprising:
    decoding a data string containing the original bit value according to a second decoding algorithm.

3. The decoding method of claim 1, wherein the step of decoding the at least part of the sub data units by the first decoding algorithm to obtain the decoded sub data units comprises:
    obtaining an error bit in the sub data units according to the first decoding algorithm, wherein a value of the error bit is the original bit value;
    adjusting the value of the error bit to obtain the value of the corrected bit, wherein the value of the corrected bit is the corrected bit value; and
    obtaining the decoded sub data units according to the corrected bit.

4. The decoding method of claim 1, wherein the step of restoring the value of the corrected bit to the original bit value if the corrected bit matches the reliability condition comprises:
  restoring the value of the corrected bit to the original bit value, and updating the decoded sub data units according to the value of the corrected bit.

5. The decoding method of claim 1, wherein the error checking and correcting code set comprises a plurality of first direction error correcting codes and a plurality of second direction error correcting codes, the first direction error correcting codes are respectively corresponding to a plurality of first direction data segments in the sub data units arranged in form of a matrix, and the second direction error correcting codes are respectively corresponding to a plurality of second direction data segments in the sub data units arranged in form of the matrix,
  wherein the step of decoding the at least part of the sub data units by the first decoding algorithm to obtain the decoded sub data units comprises:
  decoding the first direction data segments according to the first direction error correcting codes to obtain the decoded sub data units.

6. The decoding method of claim 5, further comprising:
  decoding the second direction data segments according to the second direction error correcting codes to obtain a plurality of updated decoded sub data units; and
  obtaining a corrected data string corresponding to the user data string according to the updated decoded sub data units.

7. The decoding method of claim 5, wherein the first direction data segments are a plurality of column data segments in the sub data units arranged in form of the matrix, and the second direction data segments are a plurality of row data segments in the sub data units arranged in form of the matrix.

8. The decoding method of claim 5, wherein the first direction error correcting codes are corresponding to a first maximum number of correctable error bits, the second direction error correcting codes are corresponding to a second maximum number of correctable error bits, and the first maximum number of correctable error bits is less than the second maximum number of correctable error bits.

9. A memory control circuit unit, for controlling a flash memory module, the flash memory module having a plurality of memory cell, the memory control circuit unit comprising:
  a host interface configured to couple to a host system;
  a memory interface configured to couple to the flash memory module;
  a memory management circuit coupled to the host interface and the memory interface; and
  an error checking and correcting circuit coupled to the memory management circuit,
  wherein the memory management circuit is configured to send a read command sequence for reading data from the memory cells according to a first voltage, wherein the data comprises a user data string and an error checking and correcting code set, and the user data string comprises a plurality of sub data units,
  wherein the error checking and correcting circuit is configured to decode at least part of the sub data units by a first decoding algorithm to obtain a plurality of decoded sub data units, wherein the decoded sub data units comprise a corrected bit, and a value of the corrected bit is decoded from an original bit value into a corrected bit value,
  wherein the error checking and correcting circuit is further configured to determine whether the corrected bit matches a reliability condition,
  wherein the error checking and correcting circuit is further configured to restore the value of the corrected bit to the original bit value if the corrected bit matches the reliability condition,
  wherein the error checking and correcting circuit is further configured to determine a preset region according to the first voltage and a first preset difference,
  wherein in the operation of determining whether the corrected bit matches the reliability condition, the error checking and correcting circuit determines whether a threshold voltage of the memory cell storing the corrected bit falls within the preset region,
  wherein the error checking and correcting circuit determines that the corrected bit does not match the reliability condition if the threshold voltage of the memory cell storing the corrected bit falls within the preset region,
  wherein the error checking and correcting circuit determines that the corrected bit matches the reliability condition if the threshold voltage of the memory cell storing the corrected bit does not fall within the preset region,
  wherein the error checking and correcting circuit is further configured to count an iteration count,
  wherein the error checking and correcting circuit is further configured to determine whether the iteration count reaches a preset count,
  wherein the error checking and correcting circuit re-determines the preset region according to the first voltage and a second preset difference if the iteration count does not reach the preset count,
  wherein the second preset difference is greater than the first preset difference.

10. The memory control circuit unit of claim 9, wherein the error checking and correcting circuit is further configured to decode a data string containing the original bit value according to a second decoding algorithm.

11. The memory control circuit unit of claim 9, wherein in the operation of decoding the at least part of the sub data units by the first decoding algorithm to obtain the decoded sub data units, the error checking and correcting circuit obtains an error bit in the sub data units according to the first decoding algorithm, wherein a value of the error bit is the original bit value,
  wherein the error checking and correcting circuit adjusts the value of the error bit to obtain the value of the corrected bit, wherein the value of the corrected bit is the corrected bit value,
  wherein the error checking and correcting circuit obtains the decoded sub data units according to the corrected bit.

12. The memory control circuit unit of claim 9, wherein in the operation of restoring the value of the corrected bit to the original bit value if the corrected bit matches the reliability condition, the error checking and correcting circuit restores the value of the corrected bit to the original bit value, and updates the decoded sub data units according to the value of the corrected bit.

13. The memory control circuit unit of claim 9, wherein the error checking and correcting code set comprises a plurality of first direction error correcting codes and a plurality of second direction error correcting codes, the first direction error correcting codes are respectively corresponding to a plurality of first direction data segments in the sub data units arranged in form of a matrix, and the second direction error correcting codes are respectively corresponding to a plurality of second direction data segments in the sub data units arranged in form of the matrix, wherein in the operation of decoding the at least part of the sub data units by the first decoding algorithm to obtain the decoded sub data units, the error checking and correcting circuit decodes the first direction data segments according to the first direction error correcting codes to obtain the decoded sub data units.

14. The memory control circuit unit of claim 13, wherein the error checking and correcting circuit is further configured to decode the second direction data segments according to the second direction error correcting codes to obtain a plurality of updated decoded sub data units, wherein the error checking and correcting circuit is further configured to obtain a corrected data string corresponding to the user data string according to the updated decoded sub data units.

15. The memory control circuit unit of claim 13, wherein the first direction data segments are a plurality of column data segments in the sub data units arranged in form of the matrix, and the second direction data segments are a plurality of row data segments in the sub data units arranged in form of the matrix.

16. The memory control circuit unit of claim 13, wherein the first direction error correcting codes are corresponding to a first maximum number of correctable error bits, the second direction error correcting codes are corresponding to a second maximum number of correctable error bits, and the first maximum number of correctable error bits is less than the second maximum number of correctable error bits.

17. A memory storage apparatus, comprising:

a connection interface unit configured to couple to a host system;

a flash memory module having a plurality of memory cells; and a memory control circuit unit coupled to the connection interface unit and the flash memory module, wherein the memory control circuit unit is configured to send a read command sequence for reading data from the memory cells according to a first voltage, wherein the data comprises a user data string and an error checking and correcting code set, and the user data string comprises a plurality of sub data units, wherein the memory control circuit unit is further configured to decode at least part of the sub data units by a first decoding algorithm to obtain a plurality of decoded sub data units, wherein the decoded sub data units comprise a corrected bit, and a value of the corrected bit is decoded from an original bit value into a corrected bit value, wherein the memory control circuit unit is further configured to determine whether the corrected bit matches a reliability condition, wherein the memory control circuit unit is further configured to restore the value of the corrected bit to the original bit value if the corrected bit matches the reliability condition, wherein the memory control circuit unit is further configured to determine a preset region according to the first voltage and a first preset difference, wherein in the operation of determining whether the corrected bit matches the reliability condition, the memory control circuit unit determines whether a threshold voltage of the memory cell storing the corrected bit falls within the preset region, wherein the memory control circuit unit determines that the corrected bit does not match the reliability condition if the threshold voltage of the memory cell storing the corrected bit falls within the preset region, wherein the memory control circuit unit determines that the corrected bit matches the reliability condition if the threshold voltage of the memory cell storing the corrected bit does not fall within the preset region, wherein the memory control circuit unit is further configured to count an iteration count, wherein the memory control circuit unit is further configured to determine whether the iteration count reaches a preset count, wherein the memory control circuit unit is further configured to re-determine the preset region according to the first voltage and a second preset difference if the iteration count does not reach the preset count, wherein the second preset difference is greater than the first preset difference.

18. The memory storage apparatus of claim 17, wherein the memory control circuit unit is further configured to decode a data string containing the original bit value according to a second decoding algorithm.

19. The memory storage apparatus of claim 17, wherein in the operation of decoding the at least part of the sub data units by the first decoding algorithm to obtain the decoded sub data units, the memory control circuit unit obtains an error bit in the sub data units according to the first decoding algorithm, wherein a value of the error bit is the original bit value, wherein the memory control circuit unit adjusts the value of the error bit to obtain the value of the corrected bit, wherein the value of the corrected bit is the corrected bit value, wherein the memory control circuit unit obtains the decoded sub data units according to the corrected bit.

20. The memory storage apparatus of claim 17, wherein in the operation of restoring the value of the corrected bit to the original bit value if the corrected bit matches the reliability condition, the memory control circuit unit restores the value of the corrected bit to the original bit value, and updates the decoded sub data units according to the value of the corrected bit.

21. The memory storage apparatus of claim 17, wherein the error checking and correcting code set comprises a plurality of first direction error correcting codes and a plurality of second direction error correcting codes, the first direction error correcting codes are respectively corresponding to a plurality of first direction data segments in the sub data units arranged in form of a matrix, and the second direction error correcting codes are respectively corresponding to a plurality of second direction data segments in the sub data units arranged in form of the matrix, wherein in the operation of decoding the at least part of the sub data units by the first decoding algorithm to obtain the decoded sub data units, the error checking and correcting circuit decodes the first direction data segments according to the first direction error correcting codes to obtain the decoded sub data units.

22. The memory storage apparatus of claim 17, wherein the memory control circuit unit is further configured to decode the second direction data segments according to the second direction error correcting codes to obtain a plurality of updated decoded sub data units, wherein the memory control circuit unit is further configured to obtain a corrected data string corresponding to the user data string according to the updated decoded sub data units.

23. The memory storage apparatus of claim 17, wherein the first direction data segments are a plurality of column data segments in the sub data units arranged in form of the matrix, and the second direction data segments are a plurality of row data segments in the sub data units arranged in form of the matrix.

24. The memory storage apparatus of claim 17, wherein the first direction error correcting codes are corresponding to a first maximum number of correctable error bits, the second direction error correcting codes are corresponding to a second maximum number of correctable error bits, and the first maximum number of correctable error bits is less than the second maximum number of correctable error bits.

* * * * *